United States Patent
Higuchi et al.

(10) Patent No.: US 9,018,068 B2
(45) Date of Patent: Apr. 28, 2015

(54) NONVOLATILE RESISTIVE MEMORY ELEMENT WITH A SILICON-BASED SWITCHING LAYER

(71) Applicant: Intermolecular Inc., San Jose, CA (US)

(72) Inventors: Randall J. Higuchi, San Jose, CA (US); Chien-Lan Hsueh, Campbell, CA (US); Yun Wang, San Jose, CA (US)

(73) Assignee: Intermolecular, Inc., San Jose, CA (US)

( * ) Notice: Subject to any disclaimer, the term of this patent is extended or adjusted under 35 U.S.C. 154(b) by 176 days.

(21) Appl. No.: 13/869,800

(22) Filed: Apr. 24, 2013

(65) Prior Publication Data

US 2014/0322884 A1    Oct. 30, 2014

(51) Int. Cl.
*H01L 45/00* (2006.01)
*H01L 27/24* (2006.01)
*H01L 21/02* (2006.01)

(52) U.S. Cl.
CPC ........ *H01L 27/2463* (2013.01); *H01L 21/0228* (2013.01); *H01L 45/04* (2013.01); *H01L 45/1233* (2013.01); *H01L 45/145* (2013.01); *H01L 45/1616* (2013.01)

(58) Field of Classification Search
CPC ..... H01L 45/08; H01L 45/145; H01L 45/148; H01L 45/16; H01L 45/1616; H01L 45/1641; H01L 21/0228; H01L 21/3211; C11G 13/0004; C11G 2213/34
USPC ..................................................... 257/2, 4
See application file for complete search history.

(56) References Cited

U.S. PATENT DOCUMENTS

| | | | |
|---|---|---|---|
| 4,960,719 A | 10/1990 | Tanaka et al. | |
| 5,047,819 A | 9/1991 | Tanaka et al. | |
| 5,278,636 A | 1/1994 | Williams | |
| 6,815,744 B1 | 11/2004 | Beck et al. | |
| 7,122,415 B2 | 10/2006 | Jang et al. | |
| 2008/0152792 A1 | 6/2008 | Lian et al. | |
| 2008/0179715 A1 | 7/2008 | Coppa | |
| 2008/0219039 A1 | 9/2008 | Kumar et al. | |

(Continued)

FOREIGN PATENT DOCUMENTS

WO    WO-2011-159584 A1    12/2011

OTHER PUBLICATIONS

Leskela et al., Atomic Layer Deposition Chemistry: Recent Developments and Future Challenges, Angew. Chem. Int. Ed. 2003, 42, pp. 5548-5554.*

(Continued)

*Primary Examiner* — Matthew Reames
*Assistant Examiner* — John Bodnar

(57) ABSTRACT

A nonvolatile resistive memory element includes a novel switching layer and methods of forming the same. The switching layer includes a material having bistable resistance properties and formed by bonding silicon to oxygen or nitrogen. The switching layer may include at least one of $SiO_x$, $SiO_xN_y$, or $SiN_x$. Advantageously, the $SiO_x$, $SiO_xN_y$, and $SiN_x$ generally remain amorphous after thermal anneal processes are used to form the devices, such as ReRAM devices.

20 Claims, 6 Drawing Sheets

(56) References Cited

U.S. PATENT DOCUMENTS

| | | |
|---|---|---|
| 2009/0227067 A1 | 9/2009 | Kumar et al. |
| 2010/0227476 A1 | 9/2010 | Peck |
| 2010/0314602 A1 | 12/2010 | Takano |
| 2012/0142180 A1* | 6/2012 | Matsushita et al. ............ 438/591 |
| 2013/0026438 A1 | 1/2013 | Wang |
| 2013/0328008 A1* | 12/2013 | Miyagawa et al. ................ 257/4 |
| 2013/0334483 A1* | 12/2013 | Ramaswamy et al. ............. 257/2 |
| 2013/0336049 A1* | 12/2013 | Jurasek .......................... 365/163 |
| 2014/0120737 A1* | 5/2014 | Swaminathan et al. ....... 438/765 |

OTHER PUBLICATIONS

Yang et al; Memristive switching mechanism for metaloxidemetal nanodevices; Jun. 15, 2008; Macmillan Publishers Limited; Nature Nanotechnology pp. 429433 vol. 3 Jul. 2008.

Chen, A., et al.; NonVolatile Resistive Switching for Advanced Memory Applications; Dec. 5, 2005; IEEE IEDM; Dec. 57 2005 4 pages.

Beck, A., et al.; Reproducible Switching Effect in Thin Oxide Films for Memory Applications; Jul. 3, 2000; IBM—International Business Machines Corporation; Applied Physics Letters vol. 77 No. 1 pp. 139141.

Kinoshita, K., et al.; Lowering the Switching Current of Resistance Random Access Memory Using a Hetero Junction Structure Consisting of Transition Metal Oxides; Jan. 1, 2006; The Japan Society of Applied Physics; Japanese Journal of Applied Physics vol. 45 No. 37 pp. L991L994.

Groner, M.D., et al.; Electrical characterization of thin Al2O3 films grown by atomic layer deposition on silicon and various metal substrates; Apr. 19, 2002; Z—Book—Elsevier; Thin Solid Films 413 186197.

\* cited by examiner

NONVOLATILE RESISTIVE MEMORY ELEMENT WITH A SILICON-BASED SWITCHING LAYER

BACKGROUND

1. Field of the Invention

This invention relates to methods of fabricating nonvolatile resistive memory elements; in particular, a nonvolatile resistive memory element with a silicon-based switching layer.

2. Description of the Related Art

Nonvolatile memory elements are used in devices requiring persistent data storage, such as digital cameras and digital music players, as well as in computer systems. Electrically-erasable programmable read only memory (EPROM) and NAND flash are nonvolatile memory technologies currently in use. However, as device dimensions shrink, scaling issues pose challenges for traditional nonvolatile memory technology. This has led to the investigation of alternative nonvolatile memory technologies, including resistive switching nonvolatile memory.

Resistive-switching-based nonvolatile memory is formed using memory elements that are bistable, i.e., having two stable states with different resistances. A bistable memory element can be placed in a high resistance state or a low resistance state by application of suitable voltages or currents. Voltage pulses are typically used to switch the bistable memory element from one resistance state to the other. Subsequently, nondestructive read operations can be performed on the memory element to ascertain the value of a data bit stored therein.

As resistive switching memory device sizes are scaled downward in size, it is important to reduce the required currents and voltages necessary to reliably set, reset and/or determine the desired "on" and "off" states of the device, thereby minimizing power consumption of the device, resistive heating of the device, and cross-talk between adjacent devices. However, the high dielectric constant materials currently considered for use as bistable memory elements in such devices, such as $HfO_x$, $ZrO_x$, $TaO_x$, $TiO_x$, and $AlO_x$, can present both performance and manufacturing challenges. For example, these high dielectric constant (high-k") materials are generally difficult to deposit reliably in the very thin layers desired for resistive switching memory devices. Furthermore, such high-k materials may also not be able to achieve the data retention performance standard expected of nonvolatile memory devices.

In light of the above, there is a need in the art for nonvolatile resistive switching memory devices that are easily manufactured and have robust data retention.

SUMMARY

Embodiments according to the invention set forth a nonvolatile resistive memory element that includes a novel switching layer and methods of forming the same. The switching layer includes a material that has bistable resistance properties and is formed by bonding silicon to oxygen or nitrogen. In some embodiments, the switching layer includes at least one of $SiO_x$, $SiO_xN_y$, or $SiN_x$. The novel switching layer may be formed by such methods as atomic layer deposition (ALD) or chemical vapor deposition (CVD).

Advantageously, $SiO_x$, $SiO_xN_y$, and $SiN_x$ deposited by ALD or CVD are largely amorphous, providing for a lower density of oxygen vacancies and higher defect energy than many high-k materials. They remain amorphous even after thermal anneal processes used in the formation of some ReRAM devices. Consequently, the switching properties of these materials will not be altered during the manufacturing process. Furthermore, the low density of oxygen vacancies and higher defect energies associated with these materials enable the use of lower operating voltage and/or improved data retention performance in ReRAM devices using such materials as a switching layer.

In some embodiments, a nonvolatile memory element comprises a first layer operable as an electrode layer formed on a substrate, a second layer operable as an electrode layer, and a resistive switching layer disposed between the first layer and the second layer. The resistive switching layer includes a material formed by the bonding of silicon (Si) and oxygen (O), that material being deposited by an atomic layer deposition process.

According to other embodiments, a nonvolatile memory element comprises a first layer operable as an electrode layer formed on a substrate, a second layer operable as an electrode layer, and a resistive switching layer disposed between the first layer and the second layer. The resistive switching layer includes a material formed by the bonding of silicon (Si) and nitrogen (N), that material being deposited by an atomic layer deposition process.

According to other embodiments, a method of forming a nonvolatile memory element in a ReRAM device includes the steps of forming a first layer that is operable as an electrode layer, performing an atomic layer deposition process on the first layer to form a resistive switching layer that includes silicon (Si) bonded to oxygen (O), and forming a second layer operable as an electrode layer, so that the resistive switching layer is disposed between the first layer and the second layer.

According to other embodiments, a method of forming a nonvolatile memory element in a ReRAM device includes the steps of forming a first layer that is operable as an electrode layer, performing an atomic layer deposition process on the first layer to form a resistive switching layer that includes silicon (Si) bonded to nitrogen (N), and forming a second layer operable as an electrode layer, so that the resistive switching layer is disposed between the first layer and the second layer.

BRIEF DESCRIPTION OF THE DRAWINGS

So that the manner in which the above recited features of embodiments can be understood in detail, a more particular description of embodiments, briefly summarized above, may be had by reference to the appended drawings. It is to be noted, however, that the appended drawings illustrate only typical embodiments and are therefore not to be considered limiting in scope.

For clarity, identical reference numbers have been used, where applicable, to designate identical elements that are common between figures. It is contemplated that features of one embodiment may be incorporated in other embodiments without further recitation.

DETAILED DESCRIPTION

Materials used as the switching layer of a nonvolatile resistive memory element are generally required to have bistable electrical switching properties and, ideally, can be operated with low switching current and formed with a minimal forming voltage. A nonvolatile memory element with a novel variable resistance layer and methods of forming the same are described. The novel variable resistance layer has bistable resistance properties and includes a silicon-based material formed by bonding silicon to oxygen or nitrogen.

Figure 1:
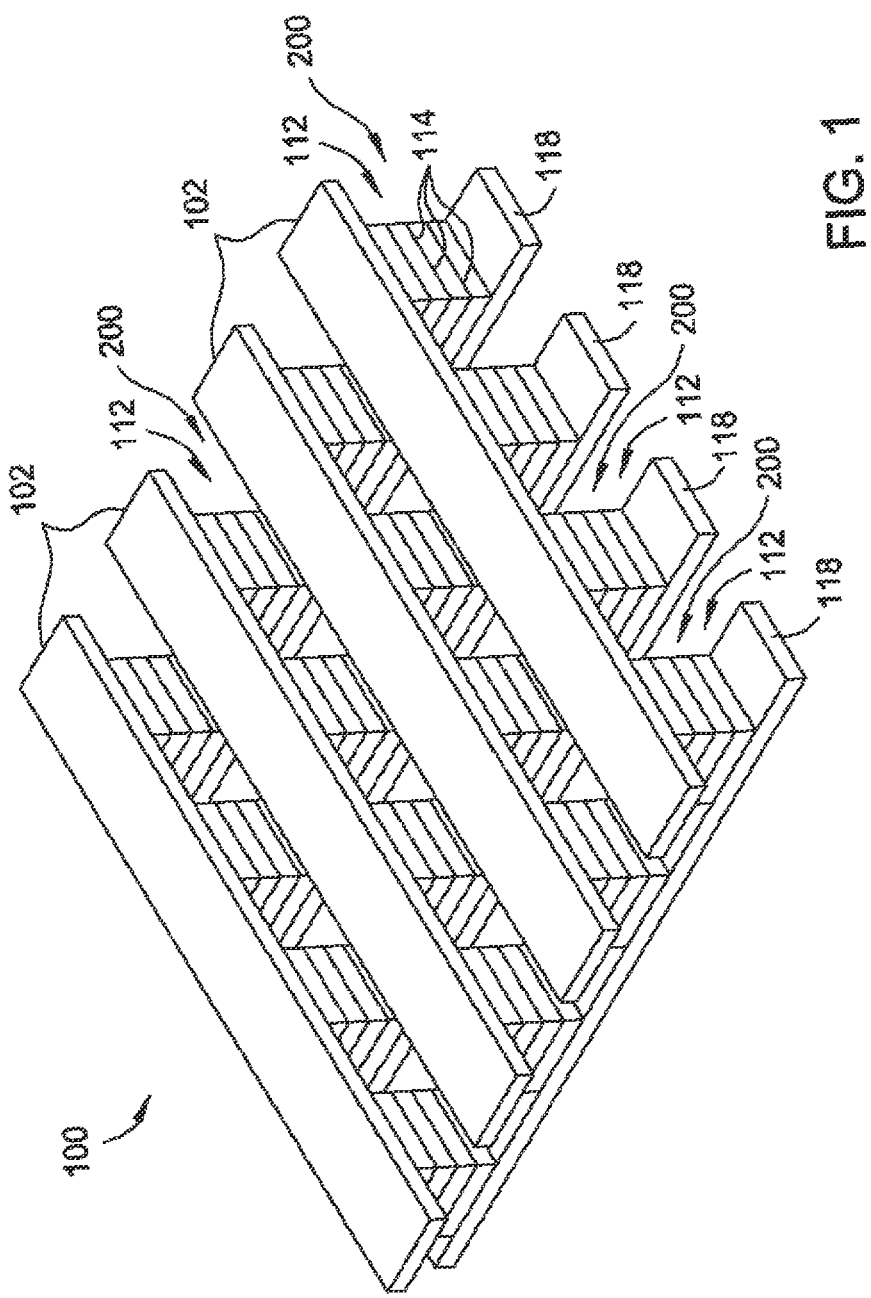
FIG. 1 is a perspective view of a memory array of memory devices, configured according to embodiments described herein.

FIG. 1 is a perspective view of a memory array 100 of memory devices 200. Memory array 100 may be part of a larger memory device or other integrated circuit structure, such as a system-on-a-chip type device. Memory array 100 may be formed as part of a high-capacity nonvolatile memory integrated circuit, which can be used in various electronic devices, such as digital cameras, mobile telephones, hand-held computers, and music players. For clarity, memory array 100 is illustrated as a single layer memory array structure. However, memory arrays such as memory array 100 can also be stacked in a vertical fashion to make multilayer memory array structures.

Each of memory devices 200 comprises a nonvolatile resistive switching memory device, such as a resistive random access memory (ReRAM) device. Memory device 200 comprises a novel memory element 112 that may be formed from one or more material layers 114. Material layers 114 include a novel variable resistance layer that includes a material that has bistable resistance properties and is formed by bonding silicon to oxygen or nitrogen. The novel variable resistance layer is described below in conjunction with FIG. 4. In some embodiments, the switching layer includes at least one of $SiO_x$, $SiO_xN_y$, or $SiN_x$, and atomic layer deposition (ALD) processes well-known in the art can be used to form such a switching layer. In some embodiments, memory device 200 also includes a current steering device, which is described below in conjunction with FIGS. 2A and 2B.

Read and write circuitry (not shown) is connected to memory devices 200 using electrodes 102 and electrodes 118. Electrodes 102 and electrodes 118, which are sometimes referred to as "bit lines" and "word lines," are tied together for multiple cells or an array via interconnects and are used to read and write data into memory elements 112 in memory devices 200. Individual memory devices 200 or groups of memory devices 200 can be addressed using appropriate sets of electrodes 102 and electrodes 118.

Figure 2A:
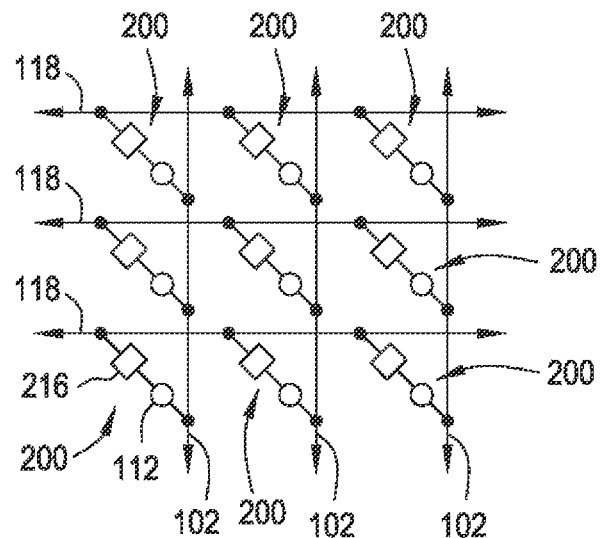
FIG. 2A schematically illustrates, according to some embodiments, memory array 100 having a plurality of memory devices 200 connected together to form part of a high-capacity nonvolatile memory array that, together with memory read and write circuitry and other peripheral devices, constitutes a memory chip.

FIG. 2A schematically illustrates, according to some embodiments, memory array 100 having a plurality of memory devices 200 connected together to form part of a high-capacity nonvolatile memory array that, together with memory read and write circuitry and other peripheral devices, constitutes a memory chip. In accordance with some embodiments, each of the memory devices 200 may include one resistive switching memory element 112 and one current steering element 216 (e.g., a diode-type current steering device) that are connected to at least one of the electrodes 102 and at least one of the electrodes 118. Each of the memory devices 200 can be accessed individually using appropriate sets of discrete word-lines and bit-lines, which are comprised by at least a portion of the electrodes 102 and 118. In other embodiments, memory devices 200 may be configured without current steering element 216.

In some embodiments, current steering device 216 may include two or more layers of semiconductor material, such as two or more doped silicon layers, that are configured to allow or inhibit the current flow in different directions through the memory element 112. In addition, read and write circuitry (not shown) is coupled to memory device 200 via electrodes 102 and electrodes 118 as shown. Generally, such read and write circuitry is configured to both sense the resistance state and set the resistance state of memory device 200.

Figure 2B:
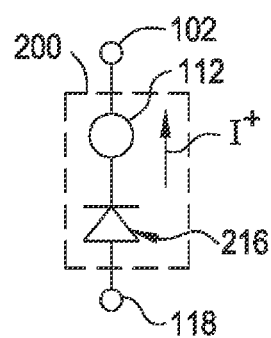
FIG. 2B schematically illustrates a memory device configured to allow current to flow through the memory device in a forward direction.

FIG. 2B schematically illustrates memory device 200 configured to allow current to flow through memory device 200 in a forward direction ("I$^+$"). However, a reduced current can also flow in the opposing direction through the device by the application of a reverse bias to electrodes 102 and electrodes 118.

Figure 3:
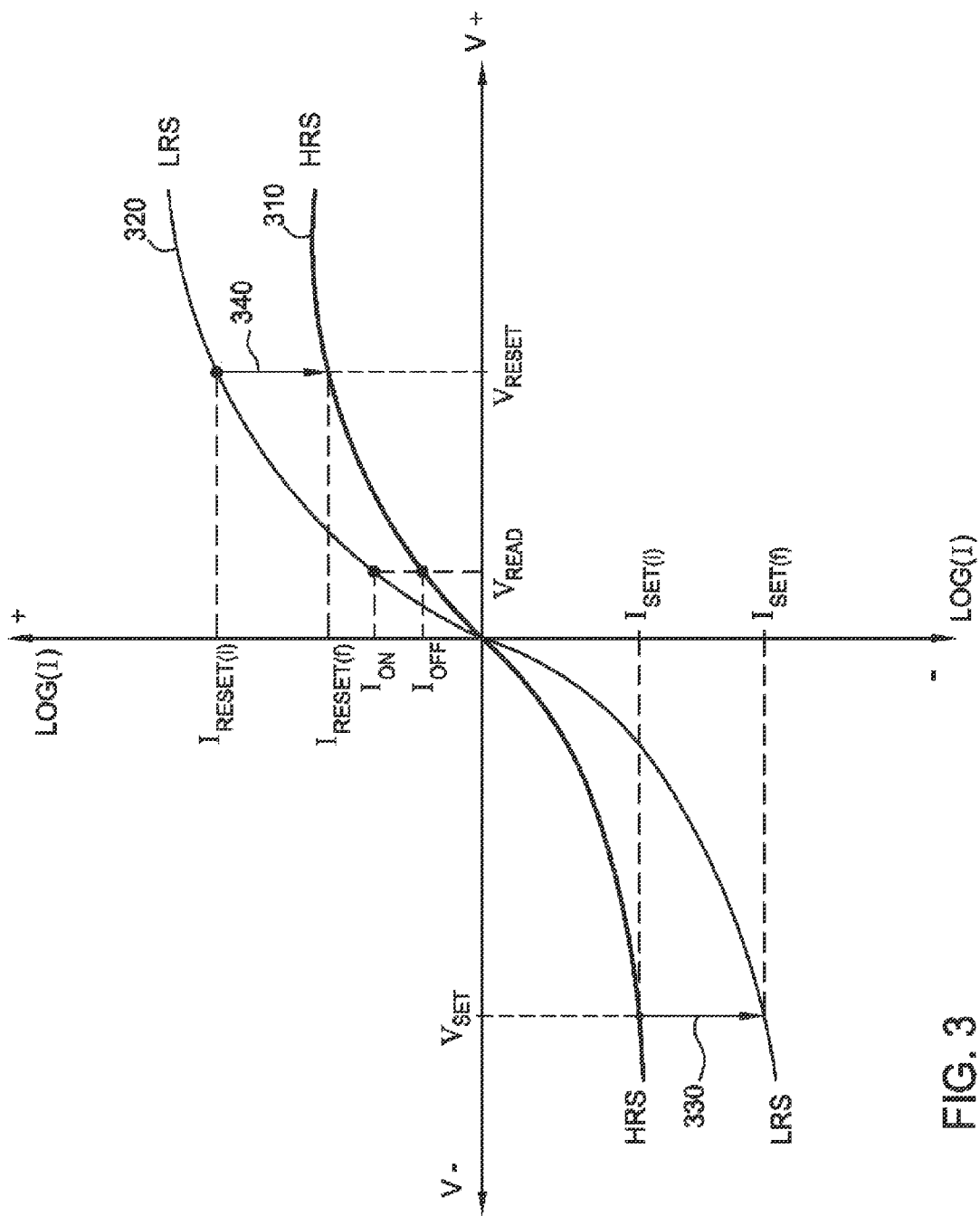
FIG. 3 schematically illustrates exemplary plots of measured log current (I) values versus applied voltages (V) of exemplary embodiments of a memory device having a resistive switching memory element.

FIG. 3 schematically illustrates exemplary plots of measured log current (I) values versus applied voltages (V) of exemplary embodiments of memory device 200 having a resistive switching memory element 112. The resistive switching memory element may be placed in two stable resistance states: a low-resistance-state (LRS), following the I-V curve of a LRS curve 320, or a high-resistance-state (HRS), following the I-V curve of a HRS curve 310.

In general, by sweeping the voltage applied to the electrode layers 102 and 118 between two applied voltages (e.g., between $V_{SET}$ (e.g., −3 volts) and $V_{RESET}$ (e.g., +4 volts)) while memory device 200 is in the low resistance state, the LRS curve 320 is obtained. On the other hand, by sweeping the voltage applied to the electrode layers 102 and 118 between two applied voltages (e.g., between $V_{SET}$ and $V_{RESET}$) while memory device 200 is in the high resistance state, the HRS curve 310 is obtained. Accordingly, resistive switching memory element 112 may either be in a high resistance state (HRS) or a low resistance state (LRS). Resistive switching memory element 112 within memory device 200 can be selectively chosen by read-and-write circuitry for memory array 100 to switch between its resistance states. Current steering element 216 is used to regulate current (e.g., allow or inhibit, etc.) so that current will flow through only the desired memory cells when the appropriate set of word-lines and bit-lines and/or electrodes are selected.

During a "set" operation, because of the physical and electrical characteristics of variable resistance layer 206, resistive switching memory element 112 of memory device 200 can switch from the HRS to the LRS (e.g., following the path of an arrow 330), when a "set" switching pulse (e.g., a pulse at $V_{SET}$ voltage level) is applied and delivered through the memory device. By applying the "set" switching pulse to memory device 200, the current flowing through memory device 200 can shift from the initial "set" current level, $I_{SET(i)}$, to the final "set" current level, $I_{SET(f)}$, according to the arrow 330, due to the change in the resistance of the variable resistance layer 206.

In addition, during a "reset" operation, variable resistance layer 206 can function to switch from the LRS to the HRS (e.g., following the path of arrow 340), when a "reset" switching pulse (e.g., a pulse at $V_{RESET}$ voltage level) is delivered to memory device 200. The current flowing through memory device 200 can shift from the initial "reset" current level, $I_{RESET(i)}$, to the final "reset" current level, $I_{RESET(f)}$, due to the change in the resistance of variable resistance layer 206.

During a read operation, the logic state of resistive switching memory element 112 in memory device 200 can be sensed by applying a sensing voltage (i.e., a "read" voltage $V_{READ}$ as shown in FIG. 3, (e.g., applying a sense pulse at about +0.5 to +1.5 volts (V) voltage level)), to an appropriate set of electrodes 102 and 118. Depending on its history, a resistive switching memory element 112 addressed in this way may be either in a high resistance state (HRS) or a low resistance state (LRS). The resistance of resistive switching memory element 112 therefore determines what digital data is being stored by resistive switching memory element 112. If resistive switching memory element 112 is in the low resistance state (LRS), for example, resistive switching memory element 112 may be said to contain a logic one (i.e., a "1" bit). If, on the other hand, resistive switching memory element 112 is in the high resistance state (HRS), resistive switching memory element 112 may be said to contain a logic zero (i.e., a "0" bit).

During a programming operation, the resistive state of a memory element can be changed by application of suitable programming signals to appropriate sets of the electrode layers 102 and 118. In some examples, initially, resistive switching memory element 112 may be in a high resistance state (e.g., storing a logic "zero"). The high resistance state (HRS) of resistive switching memory element 112 can be sensed by read circuitry (not shown) for memory array 100 using the electrodes 102 and 118. For example, such read circuitry may apply a read voltage pulse at a $V_{READ}$ voltage level (e.g., +0.5V) to resistive switching memory element 112, and can sense the resulting "off" current level ($I_{OFF}$) that flows through resistive switching memory element 112.

Next, when it is desired to store a logic "one" in memory device 200, resistive switching memory element 112 needs to be placed into its low resistance state (LRS). This may be accomplished by using write circuitry (not shown) for memory array 100 to apply a "set" voltage pulse at a $V_{SET}$ (e.g., -2V to -4V) voltage level across the electrodes 102 and 118. In some configurations, applying a negative voltage pulse at a $V_{SET}$ voltage level to resistive switching memory element 112 causes resistive switching memory element 112 to switch to its low resistance state (LRS), following the arrow 330. Resistive switching memory element 112 is changed so that, following the removal of the "set" voltage pulse, $V_{SET}$, resistive switching memory element 112 is characterized to be in a low resistance state (LRS). It is believed that the change in the resistance state of resistive switching memory element 112 may be because the reverse biasing of the device cause traps formed in a variable resistance layer in the memory element to be redistributed or filled (i.e., "trap-mediated") during this process. $V_{SET}$ and $V_{RESET}$ are generally referred to as "switching voltages" herein. The low resistance state (LRS) of the resistive switching memory element can be sensed using the read circuitry for memory array 100. When a read voltage pulse at the $V_{READ}$ level is applied to resistive switching memory element 112, the read circuitry senses the relatively high "on" current value ($I_{ON}$), indicating that resistive switching memory element 112 is in its low resistance state (LRS).

When it is desired to store a logic "zero" in the memory device 200, resistive switching memory element 112 can once again be placed in its high resistance state (HRS) by applying a positive "reset" voltage pulse at a $V_{RESET}$ (e.g., +2V to +5V) voltage level to the memory device. When write circuitry for memory array 100 applies $V_{RESET}$ to resistive switching memory element 112, it switches to its high resistance state (HRS), following the arrow 340. When the reset voltage pulse, $V_{RESET}$, is removed from resistive switching memory element 112, resistive switching memory element 112 can once again be tested whether it is in the high resistance state (HRS) by applying a read voltage pulse at the $V_{READ}$ voltage level.

While the discussion of the resistive switching memory element herein primarily provides bipolar switching examples, some embodiments of the resistive switching memory elements may use unipolar switching, where the "set" and "reset" voltage pulses have the same polarity.

It is believed that the change in the resistive state of the memory element 112 may be "trap-mediated," i.e., changes in resistive state are due to the redistribution or filling of traps or defects in a variable resistance layer of memory element 112 when voltage is applied across memory device 200. When the variable resistance layer comprises an oxide, which is sometimes referred to as a host oxide, the defects or traps are generally thought to be oxygen vacancies formed during the deposition and/or the initial "burning-in" (or "forming") of the variable resistance layer.

The variable resistance layer of a memory element may comprise a silicon-based material formed by covalent bonding of silicon to oxygen or nitrogen, such as SiOx, $SiO_xN_y$, or $SiN_x$. Such materials generally have low ionicity, containing less intrinsic oxygen vacancies and having higher defect energy than the ionic-bonded metal oxides used for variable resistance layers. Consequently, these silicon-based covalent-bonded materials may require higher forming voltages than ionic-bonded materials to function as variable resistance layers for memory elements. However, a covalent-bonded variable resistance layer may be switchable by lower operation currents (i.e., $I_{ON}$ and $I_{OFF}$ in FIG. 3), and may exhibit better data retention, than ionic-bonded variable resistance layers.

Figure 4:
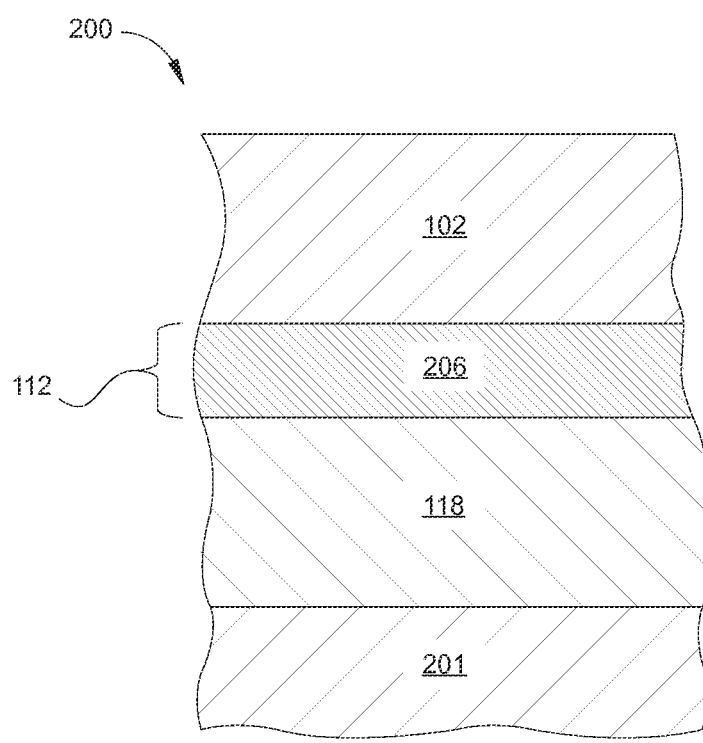
FIG. 4 is a schematic cross-sectional view of a memory device having a series of deposited layers, including a novel variable resistance layer.

FIG. 4 is a schematic cross-sectional view of memory device 200 formed using a series of deposited layers, including a novel variable resistance layer 206. In the embodiment illustrated in FIG. 4, memory device 200 is formed over, or integrated with and disposed over, portions of a surface of a substrate 201 (e.g., a silicon substrate or an SOI substrate). It is noted that relative directional terms used herein with regard to embodiments are for purposes of description only, and do not limit its scope. Specifically, directional terms such as "over," "above," "under," and the like are used under the assumption that substrate 201 on which embodiments are formed is a "bottom" element and is therefore "under" elements of the structures formed thereon.

In the embodiment illustrated in FIG. 4, memory device 200 comprises a memory element 112 disposed between electrodes 102, 118. Memory element 112 is a nonvolatile resistive memory element that includes variable resistance layer 206. In other embodiments, memory device 200 further comprises an optional intermediate electrode and optional current steering device 216 (illustrated in FIGS. 2A and 2B) disposed between electrode 118 and variable resistance layer 206.

Electrodes 102, 118 are formed from conductive materials that have a desirable work function tailored to the bandgap of the material making up variable resistance layer 206. In some configurations, electrodes 102, 118 are formed from different materials so that electrodes 102, 118 have a work function that differs by a desired value, e.g., 0.1 eV, 0.5 eV, 1.0 eV, etc.

For example, in some embodiments, electrode 102 is comprised of TiN, which has a work function of 4.5-4.6 eV, while electrode 118 can be n-type polysilicon, which has a work function of approximately 4.1-4.15 eV. Other electrode materials suitable for use in electrode 102 and/or electrode 118 include p-type polysilicon (4.9-5.3 eV), n-type polysilicon, transition metals, transition metal alloys, transition metal nitrides, transition metal carbides, tungsten (4.5-4.6 eV), tantalum nitride (4.7-4.8 eV), molybdenum oxide (~5.1 eV), molybdenum nitride (4.0-5.0 eV), iridium (4.6-5.3 eV), iridium oxide (~4.2 eV), ruthenium (~4.7 eV), and ruthenium oxide (~5.0 eV). Other potential electrode materials include a titanium/aluminum alloys (4.1-4.3 eV), nickel (~5.0 eV), tungsten nitride (~4.3-5.0 eV), tungsten oxide (5.5-5.7 eV), aluminum (4.2-4.3 eV), copper or silicon-doped aluminum (4.1-4.4 eV), copper (~4.5 eV), hafnium carbide (4.8-4.9 eV), hafnium nitride (4.7-4.8 eV), niobium nitride (~4.95 eV), tantalum carbide (approximately 5.1 eV), tantalum silicon nitride (~4.4 eV), titanium (4.1-4.4 eV), vanadium carbide (~5.15 eV), vanadium nitride (~5.15 eV), and zirconium nitride (~4.6 eV). In some embodiments, electrode 102 is a metal, metal alloy, metal nitride or metal carbide formed from an element selected from a group of materials consisting of titanium (Ti), tungsten (W), tantalum (Ta), cobalt (Co), molybdenum (Mo), nickel (Ni), vanadium (V), hafnium (Hf) aluminum (Al), copper (Cu), platinum (Pt), palladium (Pd), iridium (Ir), ruthenium (Ru), and combinations thereof. In some examples, electrode 102 comprises a metal alloy selected from the group of a titanium/aluminum alloy ($Ti_xAl_y$), or a silicon-doped aluminum (AlSi).

Variable resistance layer 206 comprises a covalent-bonding dielectric material having properties that allow it to be switched between two or more stable resistive states. The covalent-bonding dielectric material comprises a silicon-based material that is formed on electrode 118 using an atomic layer deposition (ALD) process, described in greater detail below. In some embodiments, variable resistance layer 206 has a thickness of between about 10 Å and about 100 Å, and may include $SiO_x$, $SiO_xN_y$, and/or $SiN_x$.

In some embodiments, the parameters of the ALD process are manipulated to create more defects in the variable resistance layer than would typically be found in bulk materials or otherwise-formed thin films with similar compositions. The extra defects facilitate switching in materials that might not otherwise switch easily or reliably. Some of these materials have historically been considered poor candidates for ReRAM switching layers because of their typical lack of defects. Some embodiments of ReRAM stacks may optionally combine covalent-bonding variable resistance layers with one or more metal oxide layers such as $HfO_x$, $ZrO_x$, $TaO_x$, $TiO_x$, $AlO_x$.

Figure 5:
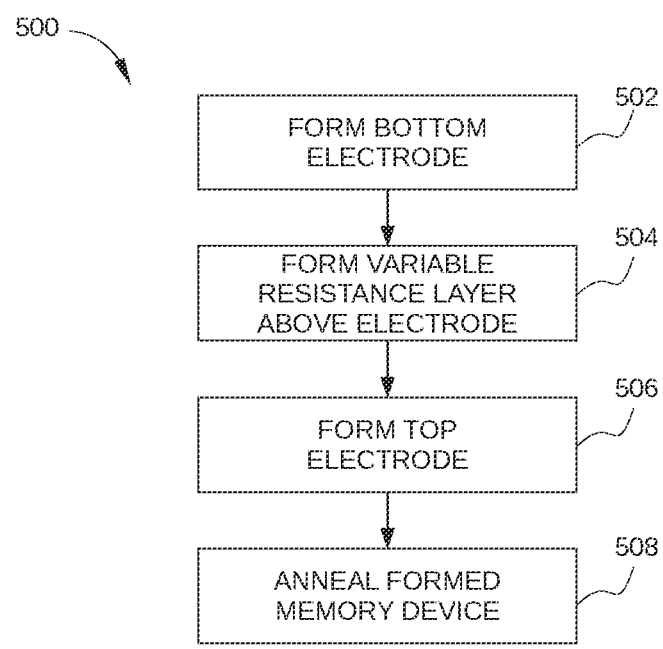
FIG. 5 illustrates a process sequence for forming a memory device, according to embodiments described.

FIG. 5 sets forth a flowchart of method steps in a process sequence 500 for forming a memory device (e.g., 200). Although the method steps are described in conjunction with memory device 200 in FIG. 4, persons skilled in the art will understand that formation of other resistive switching memory devices using process sequence 500 may be performed.

As shown, sequence (method) 500 begins at step 502, in which electrode 118 is formed on substrate 201 using one or more of the materials listed above in conjunction with FIG. 4. In some embodiments, electrode 118 is a highly doped polysilicon layer that is formed on substrate 201 using a conventional CVD polysilicon deposition technique. In some embodiments, electrode 118 is between about 50 and about 1000 Å thick.

In step 504, variable resistance layer 206 is formed on or above electrode 118. In some embodiments, variable resistance layer 206 is formed directly on electrode 118 as shown in FIG. 4. In other embodiments, variable resistance layer 206 is formed on one or more intervening layers formed on electrode 118. The intervening layers may include a layer of metal oxide (e.g., $HfO_x$, $ZrO_x$, $TaO_x$, $TiO_x$, $AlO_x$). Variable resistance layer 206 is formed using one or more deposition processes, so that variable resistance layer 206 includes silicon (Si) bonded to oxygen (O) and/or nitrogen (N). Various methods of depositing variable resistance layer 206 may be used and are described below in conjunction with FIGS. 6 and 7.

In step 506, electrode 102 is formed on or above variable resistance layer 206 as shown in FIG. 4 using one or more of the materials suitable for electrode 102 listed above in conjunction with FIG. 4. In some embodiments, electrode 102 is formed directly on variable resistance layer 206 as shown in FIG. 4. In other embodiments, electrode 102 is formed on one or more intervening layers formed on variable resistance layer 206. The intervening layers may include a layer of metal oxide (e.g., $HfO_x$, $ZrO_x$, $TaO_x$, $TiO_x$, and AlOx). Electrode 102 may be formed using a deposition process, such as a PVD, CVD, ALD or other similar process. In some embodiments, electrode 102 is between about 50 Å and 1000 Å thick.

Step 508 is an optional step, the memory device formed to that point can be thermally processed, e.g., via an anneal process. For example, in some embodiments, the current steering element 216 is a diode-type current steering device, and a thermal anneal process may be used to activate said diode. The specification of the annealing process' temperature and duration is a function of the configuration of memory device 200 and current steering device 216 as well as the materials included in memory device 200. For example, in some embodiments, the anneal process takes place at temperatures between about 500° C. and 1000° C. Duration of the anneal process can also vary greatly, e.g. varying between about 30 seconds and 30 minutes depending on the configuration of memory device 200. It is noted that the materials used to form variable resistance layer 206, in which silicon is bonded to oxygen and/or nitrogen, are known to have relatively high crystallization temperatures, and thereby retain an amorphous structure after undergoing the thermal anneal process of step 508, and as such the amorphous structure provides a lower density of oxygen vacancies and higher defect energies enabling the use of lower operating voltage and/or improved data retention performance in ReRAM devices.

Figure 6:
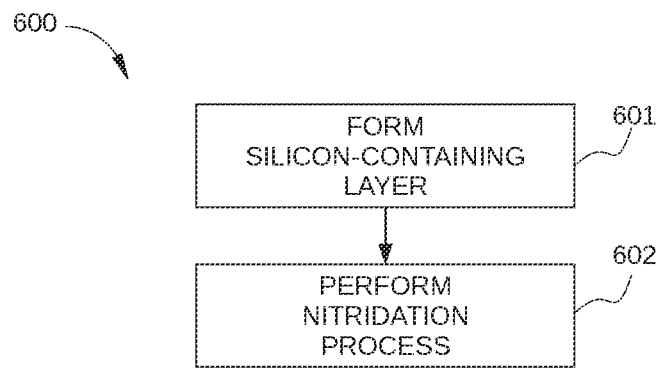
FIG. 6 illustrates a process sequence for forming a silicon-based variable resistance layer, according to embodiments described herein.
Figure 7:
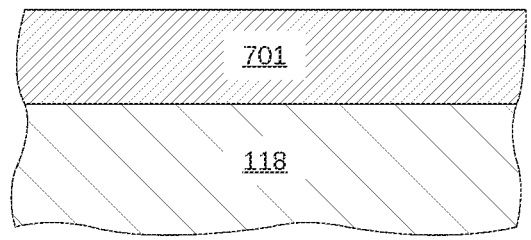
FIG. 7 illustrates a cross-sectional view of a memory device produced after following the process sequence of FIG. 6.

FIG. 6 sets forth a flowchart of method steps in a process sequence 600 for forming a silicon-containing variable resistance layer 206. FIG. 7 illustrates a cross-sectional view of memory device 200 after the execution of process sequence 600. Although the method steps are described in conjunction with memory device 200 in FIG. 4, persons skilled in the art will understand that the formation of other resistive switching memory devices using process sequence 600 can be utilized.

As shown, sequence (method) 600 begins at step 601, in which a silicon-containing layer 701 is formed on a desired surface, such as the surface of electrode 118. Silicon-containing layer 701 (illustrated in FIG. 7) may include SiOx suitable for use as variable resistance layer 206 in FIG. 4. Silicon-containing layer 701 is deposited using an ALD process, and may have a thickness between about 10 Å and about 100 Å.

In some embodiments, the ALD process of step 601 includes heating the substrate to a desired temperature, e.g., between 200° C. and 450° C., and exposing the surface subject to deposition (e.g., the surface of electrode 118) to alternating pulses of tris-dimethylamino-silane (3DMASi) and ozone ($O_3$) to form a monolayer of $SiO_x$. In some such embodiments, silicon-containing layer 701 is deposited at a rate of 0.50 Å/cycle on a substrate that is at 350° C., where each cycle includes a 0.5 second pulse of 3DMASi followed by a 20 second pulse of ozone. (Sub-angstrom thicknesses in the context of ALD may refer to sub-monolayers. A sub-monolayer is non-contiguous; when there are spaces between the deposited atoms or molecules, the average layer thickness can be less than the size of a molecule). In such embodiments, the above-described cycles can be repeated until a desired thickness of $SiO_X$ in silicon-containing layer 701 is achieved. In some embodiments, silicon-containing layer 701 is suitable for use as variable resistance layer 206 in FIG. 4, and in such embodiments, method 600 ends after completion of step 601.

In other embodiments, silicon-containing layer 701 may include $SiO_xN_y$, which may have more defects than ALD-deposited $SiO_X$ due to the incorporation of nitrogen. This higher concentration of defects is desirable for variable resistance layer 206. In such embodiments, the ALD process of step 601 may further include the incorporation of nitrogen into silicon-containing layer 701 during step 601. Specifically, the heated surface of electrode 118 is also exposed to pulses of ammonia ($NH_3$) in each ALD cycle of step 601 to form a monolayer of $SiO_xN_y$ with each pulse. These ammonia pulses may be interspersed between the 3DMASi pulses and ozone pulses. Alternatively, the ammonia pulses in step 601 may be performed concurrently with either the 3DMASi pulses or the ozone pulses. Such $3DMASi/O_3/NH_3$ cycles are repeated in step 601 until a desired thickness of $SiO_xN_y$ is achieved.

In some embodiments, variable resistance layer 206 in FIG. 4 includes $SiO_xN_y$ that is formed in a two-step process. First, as described above in step 601, silicon-containing layer 701 is formed by the deposition of $SiO_X$. Then, in step 602 silicon-containing layer 701 undergoes a nitridization process.

In step 602, silicon-containing layer 701 undergoes a nitridization process. In some embodiments, the nitridization process of step 602 comprises a decoupled plasma nitridization (DPN) process on the resistive switching layer, and in another embodiment the nitridization process of step 602 comprises a rapid thermal nitridization (RTN) process. As a result of said nitridization process, silicon-containing layer 701 is converted to a $SiO_xN_y$ layer.

In some embodiments, variable resistance layer 206 comprises a $SiN_X$ layer that includes silicon bonded to nitrogen. In such embodiments, silicon-containing layer 701 in FIG. 7 is formed by an ALD process in which the surface of electrode 118 is heated to a desired temperature, e.g., to a temperature between 200° C. and 450° C., and is then exposed to alternating pulses of silane ($SiH_4$) and ammonia to form a monolayer of $SiN_X$ on the surface of electrode 118. In such embodiments, these ALD cycles can be repeated until a desired thickness of $SiN_X$ in silicon-containing layer 701 is achieved.

While embodiments are described herein in terms of resistive switching memory elements that are used to form memory arrays, embodiments can be applied to other resistive memory devices without deviating from the basic concepts illustrated by the embodiments described herein.

In sum, embodiments provide a nonvolatile resistive memory element having a novel variable resistance layer that includes silicon bonded to oxygen and/or nitrogen. The novel variable resistance layer may operate with improved data retention due to higher defect energies associated with such silicon-based materials and, in some embodiments, lower operating currents.

While the foregoing is directed to embodiments described, other and further embodiments may be devised without departing from the basic scope thereof, and the scope thereof is determined by the claims that follow.

We claim:

1. A method of forming a nonvolatile memory element in a ReRAM device, the method comprising:
    forming a first layer on a substrate;
    forming a variable resistance layer above the first layer; and
    forming a second layer above the variable resistance layer;
        wherein the first layer and the second layer are each operable as electrodes;
        wherein the forming of the variable resistance layer comprises multiple atomic layer deposition cycles,
        wherein each of the multiple atomic layer deposition cycles comprises a tris-dimethylamino-silane pulse, an ozone pulse, and an ammonia pulse; and
        wherein the variable resistance layer comprises silicon, nitrogen, and oxygen.

2. The method of claim 1, further comprising performing a thermal process, wherein the variable resistance layer is amorphous after the thermal process.

3. The method of claim 2, wherein the thermal process comprises annealing.

4. The method of claim 3, wherein the annealing takes place at temperatures between about 500° C. and 1000° C.

5. The method of claim 3, wherein a duration of the annealing is between about 30 seconds and 30 minutes.

6. The method of claim 1, wherein the variable resistance layer has a thickness of between 10 Å and 100 Å.

7. The method of claim 1,
    wherein a rate of the atomic layer deposition is about 0.50 Å/cycle;
    wherein the substrate is maintained at about 350° C. while forming the variable resistance layer;
    wherein the tris-dimethylamino-silane pulse has a duration of about 0.5 seconds; and
    wherein the ozone pulse has a duration of about 20 seconds.

8. The method of claim 1, wherein each of the multiple atomic layer deposition cycles forms a monolayer of SiOxNy.

9. The method of claim 1, wherein the ammonia pulse is concurrent with the ozone pulse.

10. The method of claim 1, wherein the ammonia pulse is interspersed between the tris-dimethylamino-silane pulse and the ozone pulse in each of the multiple atomic layer deposition cycles.

11. The method of claim 1, wherein the multiple atomic layer deposition cycles are performed while the substrate is maintained at a temperature of between 200° C. and 450° C.

12. The method of claim 1, further comprising, prior to forming the variable resistance layer, forming an intervening layer on the first layer, the intervening layer comprising a metal oxide.

13. The method of claim 12, wherein the metal oxide comprises one of HfOx, ZrOx, TaOx, TiOx, or AlOx.

14. The method of claim 1, further comprising forming a current steering device disposed between the variable resistance layer and one of the first layer and the second layer.

15. The method of claim 1, wherein a difference of work functions the first layer and the second layer is at least 0.1 eV.

16. The method of claim 1, wherein a difference of work functions the first layer and the second layer is at least 0.5 eV.

17. The method of claim 1, wherein the first layer comprises n-type polysilicon, and wherein the second layer comprises titanium nitride.

18. The method of claim 1, wherein the first layer comprises titanium nitride, and wherein the second layer comprises n-type polysilicon.

19. The method of claim 1, wherein the first layer or the second layer comprises a metal alloy.

20. The method of claim 19, wherein the metal alloy comprises one of a titanium-aluminum alloy or a silicon-doped aluminum.

* * * * *